United States Patent [19]

Setoyama et al.

[11] Patent Number: 5,085,755
[45] Date of Patent: Feb. 4, 1992

[54] SPUTTERING APPARATUS FOR FORMING THIN FILMS

[75] Inventors: Eiji Setoyama; Mitsuhiro Kamei, both of Hitachi; Yasunori Ohno, Mito, all of Japan

[73] Assignee: Hitachi, Ltd., Tokyo, Japan

[21] Appl. No.: 450,461

[22] Filed: Dec. 14, 1989

[30] Foreign Application Priority Data

Dec. 19, 1988 [JP] Japan .................. 63-318418

[51] Int. Cl.$^5$ .............................. C23C 14/34
[52] U.S. Cl. ..................... 204/298.16; 204/192.12; 204/298.19
[58] Field of Search ............ 204/192.12, 298.16, 204/298.17, 298.18, 298.19, 298.02

[56] References Cited

U.S. PATENT DOCUMENTS

| | | | |
|---|---|---|---|
| 2,239,642 | 4/1941 | Burkhardt et al. | 204/298.16 X |
| 3,325,394 | 6/1967 | Kay et al. | 204/298.16 X |
| 3,669,860 | 6/1972 | Knowles et al. | 204/298.16 X |
| 3,849,283 | 11/1974 | Jackson et al. | 204/298.16 X |
| 4,025,410 | 5/1977 | Stewart | 204/298.16 X |
| 4,405,436 | 9/1983 | Kobayashi et al. | 204/298.16 |
| 4,610,770 | 9/1986 | Saito et al. | 204/298.16 |
| 4,673,482 | 6/1987 | Setoyama et al. | 204/298.16 |
| 4,880,515 | 11/1989 | Yoshikawa et al. | 204/298.16 X |
| 4,891,560 | 1/1990 | Okumura et al. | 204/298.19 X |

Primary Examiner—Nam X. Nguyen
Attorney, Agent, or Firm—Antonelli, Terry Stout & Kraus

[57] ABSTRACT

An apparatus for forming a thin film of a given material on one or more substrates comprises a vacuum vessel, a first electrode which is provided in the vacuum vessel for holding a target plate of the given material thereon, a second electrode which is provided opposite to the first electrode in the vacuum vessel to form a discharge space between the first and second electrodes and holds the substrate(s) thereon, a gas conduit for supplying a sputtering gas into the discharge space, power sources for applying a discharge voltage between the first and second electrodes to generate a discharge plasma of the sputtering gas, and a magnetic field generating device which is provided to surround the discharge space and generates a magnetic field effective to prevent the discharge plasma from diffusing to the outside of the discharge space.

7 Claims, 4 Drawing Sheets

SPUTTERING APPARATUS FOR FORMING THIN FILMS

BACKGROUND OF THE INVENTION

1. Field of the Invention

The present invention relates to a thin film forming apparatus, and more particularly to an improvement of a sputtering apparatus for forming thin films.

2. Description of Related Art

Generally, a thin film forming apparatus has been used as means for formation of thin films of various materials in a wide range of technical fields inclusive of semiconductor technologies. Especially, a magnetron sputtering apparatus or a facing-target sputtering apparatus has been widely used in order to realize high-speed and low-temperature sputtering or to solve problems such as bombardment of a substrate with negative ions, $\gamma$ electrons, etc., emitted from a target.

In the magnetron sputtering apparatus or the facing-target sputtering apparatus, it is required that a magnetic field of one hundred to several hundred gauss is formed by a magnetic field generating device provided in rear of an electrode in order to trap $\gamma$ electrons. However, this magnetic field exerts an influence on not only the vicinity of a target but also the surface of a substrate on which a thin film is to be formed, especially on the direction of formation of magnetic domains when a magnetic film is formed. Also, in the case where the size of electrodes is made large or a distance between electrodes is widened in order to enhance the throughput, a larger magnetic field generating device is required, thereby expanding an area on which the magnetic field exerts an influence.

On the other hand, the diode sputtering apparatus has been used to form a magnetic film or a protection film for the magnetic film. This apparatus can be implemented with a simple overall construction.

The above-mentioned various sputtering apparatuses are discussed by, for example, "THIN FILM FORMATION TECHNIQUES USING SPUTTERING METHOD" published by Keiei Kaihatsu Center on June 7, 1985. The facing-target sputtering apparatus is disclosed by JP-A-62-196369, etc.

However, the conventional diode sputtering apparatus is inferior to the other sputtering apparatuses in respect of the film formation rate. Therefore, it is necessary to improve the throughput of a film forming step. For that purpose, there may be considered a method in which the throughput is improved by making the size of electrodes large to increase the number of substrates which can be placed thereon. In such a case, however, the diffusion of a plasma into the outside of two electrodes having opposite polarities becomes remarkable, as shown in FIG. 3. Namely, the plasma density $N_e$ indicated by the ordinate is rapidly lowered with the increase of a distance from the center portion, as shown in FIG. 3, so that a thin film formed is thick at the center portion but becomes rapidly thin at the outside. This tendency is remarkable as an electric power supplied is increased.

SUMMARY OF THE INVENTION

An object of the present invention is to provide a thin film forming apparatus which is effective to suppress the diffusion of plasma, thereby making the density of plasma in a discharge space between opposite electrodes uniform.

According to the present invention, there is provided an apparatus for forming a thin film of a given material on a substrate, comprising a vacuum vessel, a first electrode provided in the vacuum vessel for holding a target plate of the given material thereon, a second electrode provided opposite to the first electrode in the vacuum vessel to form a discharge space between the first and second electrodes, the second electrode holding the substrate thereon, gas introducing means for supplying a sputtering gas into the discharge space, power source means for applying a discharge voltage between the first and second electrodes to generate a discharge plasma of the sputtering gas, and magnetic field generating means provided to surround the discharge space, the magnetic field generating means generating a magnetic field which is effective to suppress the discharge plasma from diffusing to the outside of the discharge space.

With the above construction, the magnetic field (for example, a weak magnetic field on the order of 100 gauss) formed by the magnetic field generating means serves to suppress the diffusion of ions, electrons, etc., in the discharge plasma which is generated in the discharge space between the first and second electrodes (or two electrodes having opposite polarities) and would otherwise diffuse to the outside of the discharge space and/or to bend the directions of travel or diffusion of those charged particles, thereby urging reionization of the plasma. As a result, the rapid lowering of the plasma density at the marginal portions of the electrodes is prevented, thereby making it possible to make the plasma density in the discharge space uniform.

DESCRIPTION OF THE PREFERRED EMBODIMENTS

Embodiments of the present invention will now be explained in reference to the accompanying drawings.

Figure 1:
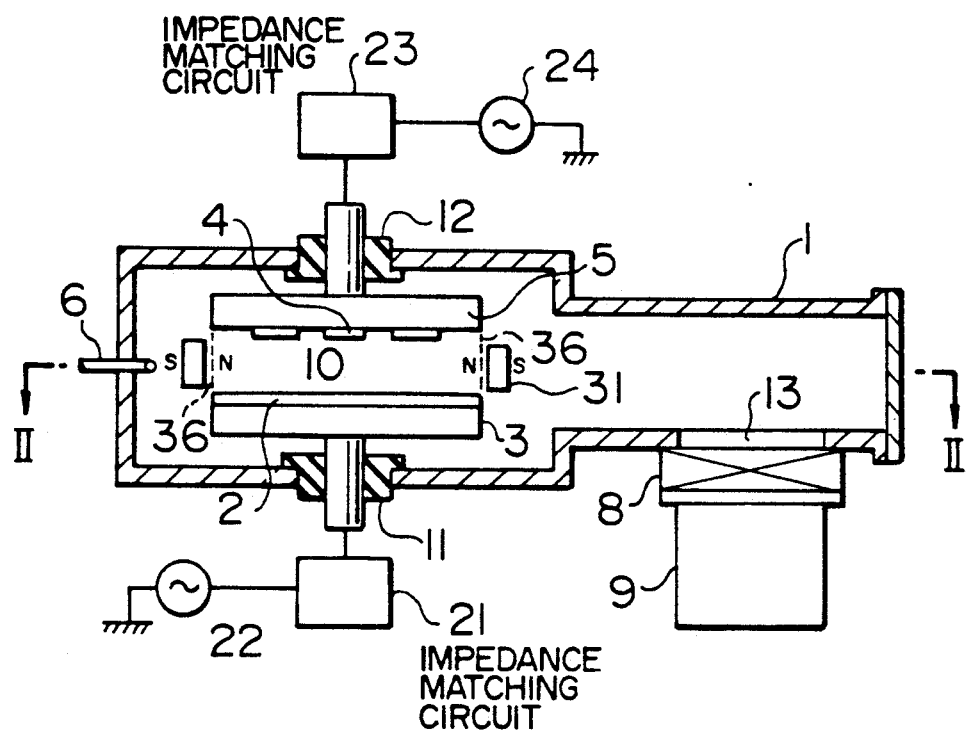
FIG. 1 shows in longitudinal cross section a front view of a thin film forming apparatus according to an embodiment of the present invention.
Figure 2:
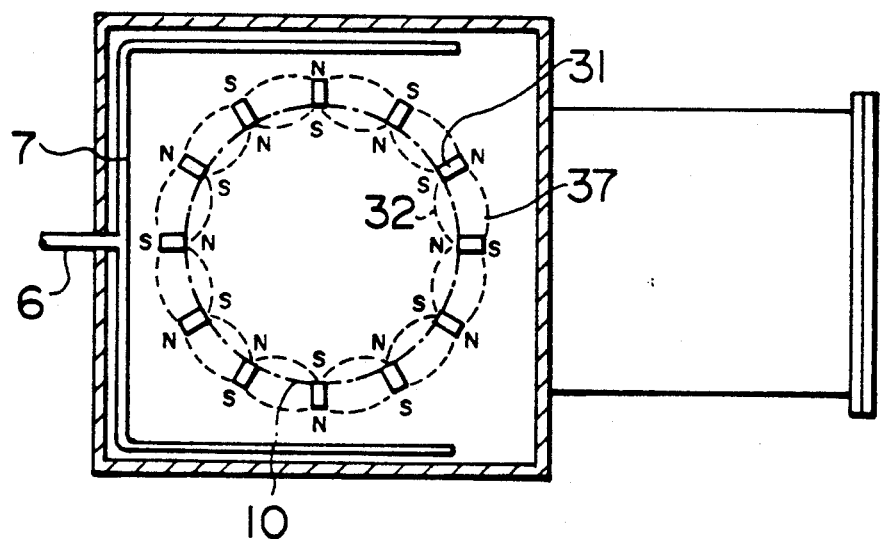
FIG. 2 is a cross section taken along line II—II in FIG. 1.
Figure 3:
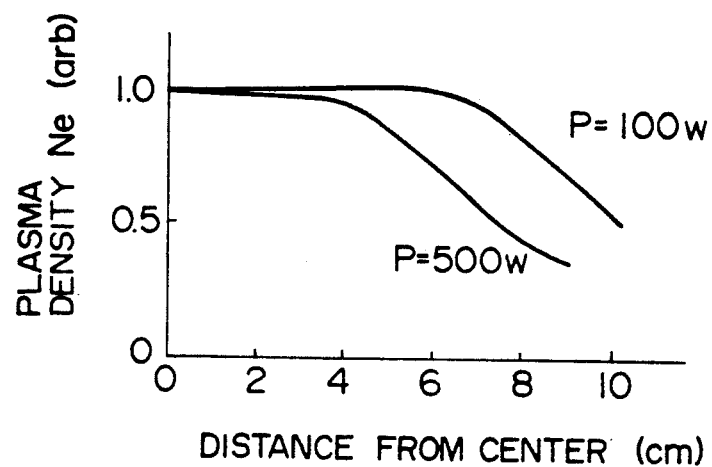
FIG. 3 is a graph showing the distribution of plasma density in a discharge space in the conventional thin film forming apparatus.

FIGS. 1 and 2 are longitudinal and lateral cross sections of a sputtering thin film forming apparatus according to an embodiment of the present invention. An electrode 3 electrically isolated by an insulator 11 and a substrate electrode 5 electrically isolated by an insulator 12 are disposed opposite to each other in a vacuum vessel 1 to form a discharge space 10 between the electrodes 3 and 5. When a sputtering discharge is carried out, the electrode 3 serves as a cathode and the substrate electrode 5 serves as an anode. Substrates 4 on each of which a thin film is to be formed are held on the substrate electrode 5 while a target plate 2 is held on the electrode 3. The vacuum vessel 1 is provided with a gas introducing port 6. A sputtering gas introduced from the gas introducing port 6 is supplied into the discharge space 10 from a multiplicity of small holes (not shown) of a gas conduit pipe 7 which is disposed extending along an inner wall surface of the vacuum vessel 1, as shown in FIG. 2. A cryopump 9 is connected to a gate valve 8 attached to an exhaust port 13 of the vacuum vessel 1 to exhaust the vacuum vessel 1. A sputtering power source is constructed by a high frequency (RF) power source 22 connected to the electrode 3 through an impedance matching circuit 21 and a high frequency power source 24 connected to the substrate electrode 5 through an impedance matching circuit 23. In the case where a conductive metal target is used, the sputtering power source may be constructed by using DC power sources in place of the high frequency power sources 22 and 24. The substrate electrode 5 may be directly grounded.

In the present invention, the electrodes 3 and 5 are provided with circular shapes having substantially the same diameter so as to form therebetween a discharge space 10 enclosed by a circular cylindrical imaginary wall surface 36 having a circular cross section and extending between the peripheral edges of the electrodes 3 and 5. Though it is preferable that the electrodes 3 and 5 have circular shapes, the present invention is not limited to the circular electrode shape. Any electrodes may be used so long as they have substantially the same dimension and the same shape and a vertical or upright imaginary wall surface enclosing a" discharge space is formed therebetween.

A plurality of permanent magnets 31 are provided in the vicinity of the periphery of the discharge space 10 where a discharge plasma is induced. As is well known in the art, a permanent magnet inherently produces a static magnetic field. The permanent magnets 31 are arranged with their polarities being different alternately in a circumferential direction and with their magnetization directions being in the radial direction of the circular electrodes 3 and 5 or perpendicular to those portions of the imaginary wall surface of the vertical cylindrical discharge space to which the permanent magnets are close. Also in the case where the electrodes have shapes other than circular shapes, permanent magnets may be disposed in proximity to the periphery of a vertical imaginary wall surface enclosing a" discharge space formed between the electrodes so that the magnetization directions of the permanent magnets are alternately inverted and are perpendicular to those portions of the imaginary wall surface of the discharge space to which the permanent magnets are near. The lines 32 of magnetic force of the permanent magnets 31 form a closed magnetic path between adjacent magnets so that a circumferential static magnetic field is formed as a whole. This magnetic field has an intensity in the order of 100 gauss and therefore exerts no influence or only a very little influence on the substrates 4 which are held on the substrate electrode 5.

Proper gaps 37 are provided between the circumferentially arranged permanent magnets 31 so that the sputtering gas from the gas conduit pipe 7 can be supplied to the discharge space 10 through the gaps without any hindrance.

The magnetic field formed in the above-mentioned manner acts on the discharge plasma diffusing from the center portion between the electrodes 3 and 5 to the outside so that the discharge plasma is confined in the discharge space 10. Therefore, it is possible to uniformly distribute the density of plasma in the discharge space 10, thereby allowing the formation of a thin film with a uniform thickness not only on each substrate 4 but also over the substrates 4. As a result, there can be obtained a thin film forming apparatus in which the throughput can be improved even if the size of electrodes is made large to increase the number of substrates 4 placed on the substrate electrode 5.

Figure 4:
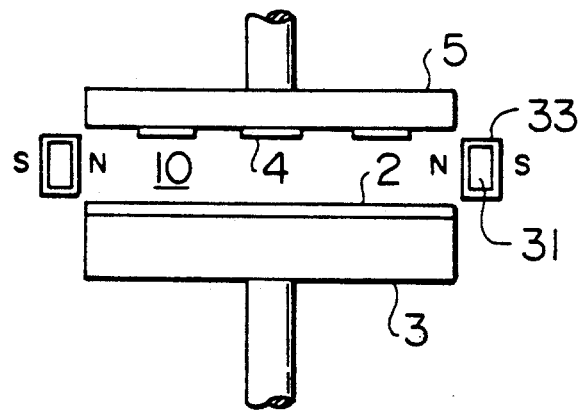
FIG. 4 is a view showing the structure of magnetic field generating means in another embodiment of the present invention.

FIG. 4 is an enlarged view of that portion of a thin film forming apparatus according to another embodiment of the present invention which includes opposing electrodes. A protective cover 33 is formed on each of a plurality of magnetic field generating elements or permanent magnets 31 which are disposed around a discharge space 10 formed between electrodes 3 and 5. In the case where there is a danger that the electrodes 3 and 5 may be electrically short-circuited due to the provision of the permanent magnet 31, an insulator is used as a material for the protective cover 33. In the case where there is a fear that the material of the permanent magnet 31 may sputter and deposit on substrates 4, a non-magnetic material or the same metal material as a target plate 2 may be used for the protective cover 33.

Figure 5:
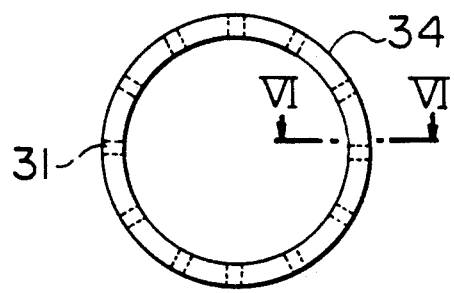
FIG. 5 is a view showing the structure of magnetic field generating means in a further embodiment of the present invention.
Figure 6:
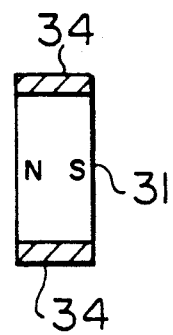
FIG. 6 is a cross section taken along line VI—VI in FIG. 5.
Figure 7:
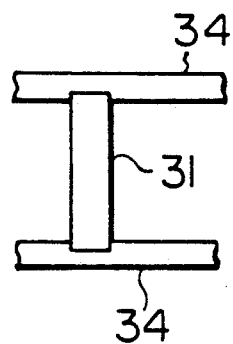
FIG. 7 is a view for explaining the construction of a portion where the magnetic field generating means of FIG. 6 is attached.

FIG. 5 is a plan view showing the construction of that portion of a thin film forming apparatus according to a further embodiment of the present invention which includes permanent magnets, FIG. 6 is a cross section taken along line VI—VI in FIG. 5, and FIG. 7 is a partial side view of the apparatus. As is apparent especially from FIGS. 5 and 7, a pair of ring-like mounting frames 34 are used to accommodate therebetween a plurality of permanent magnets 31 spaced apart from each other. The permanent magnets 31 and the mounting frames 34 are secured to each other by use of known proper means. Thus, the magnetic field generating means including the permanent magnets 31 is implemented with a united structure. Therefore, in the case where the magnetic field generating means is to be cleaned up to remove a target material deposited thereon, it is possible to take out the unit for cleaning thereof. The mounting frames 34 are made of a non-magnetic material. Each mounting frame may include a single annular ring or a pair of semi-annular rings.

Figure 8:
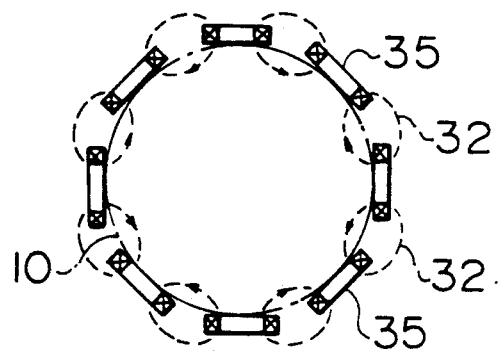
FIGS. 8 and 9 are views showing the structure of magnetic field generating means in a still further embodiment of the present invention.
Figure 9:
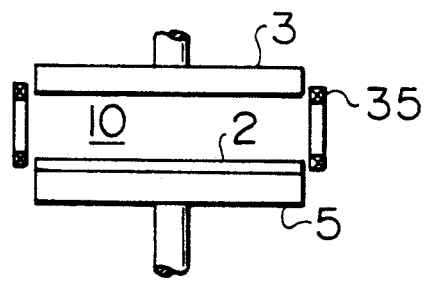

FIG. 8 is a plan view of a portion of a thin film forming apparatus according to a still further embodiment of the present invention in the vicinity of electrodes, and FIG. 9 is a partly-cut front view thereof. In the foregoing embodiments, the magnetic field acting on the discharge plasma diffusing from the center portion of the electrodes to the outside to confine the plasma in the discharge space 10 has been generated by permanent magnets. In the present embodiment, on the other hand, a plurality of coils 35 are provided around a discharge space 10 so as to generate a static magnetic field 32 having a direction indicated by arrows in FIG. 8.

Figure 10:
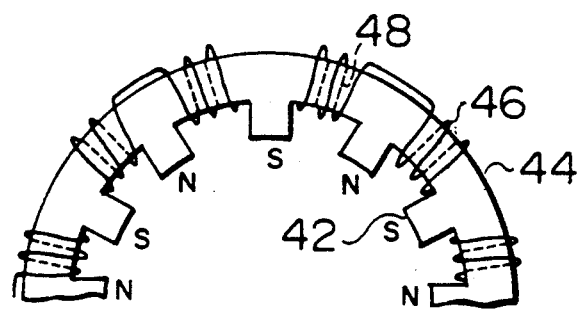
FIG. 10 is a view showing the structure of magnetic field generating means in a further embodiment of the present invention.

FIG. 10 is a view showing the structure of magnetic field generating means in a further embodiment of the present invention. In the figure, magnetic poles 42 are interconnected by a yoke 44 made of a magnetic material and a coil 46 is wound around the yoke 44 so as to generate a magnetic field having a static polarity as shown. The yoke 44 is provided with ducts 48 through which a sputtering gas introduced from a gas conduit pipe is flown into a discharge space.

In each of the foregoing embodiments, since the plurality of magnetic field generating elements disposed around the discharge space 10 are provided with gas-transmissible portions which allow the sputtering gas from the gas conduit pipe 7 (shown in FIG. 2) to flow inside the space between the opposing electrodes 3 and 5, the provision of the magnetic field generating elements around the discharge space 10 gives rise to no problem.

As has been mentioned above, in the present invention, since a plurality of magnetic field generating elements having different polarities are circumferentially disposed in the vicinity of the periphery of a discharge space, a magnetic field formed by the magnetic field generating elements serves to suppress the diffusion of a discharge plasma generated in the discharge space into the outside and to tend to effect reionization of the plasma, thereby making it possible to make the plasma density in the discharge space uniform.

We claim:

1. An apparatus for forming a thin film of a given material on a substrate, comprising:
    a vacuum vessel;
    a first electrode provided in said vacuum vessel being adapted to support a target plate of said given material;
    a second electrode provided opposite to said first electrode in said vacuum vessel to form a discharge space between said first and second electrodes, said second electrode being adapted to support said substrate;
    gas supplying means for supplying a sputtering gas into said discharge space;
    power source means for applying a discharge voltage between said first and second electrodes to generate a discharge plasma from said sputtering gas; and
    magnetic field generating means including a plurality of magnetic elements disposed at predetermined intervals around a periphery of said discharge space, said magnetic elements producing respective static magnetic fields and having respective magnetization directions lying on respective axes, said axes extending towards said discharge space, said magnetization directions of said magnetic elements being alternately reversed around said periphery of said discharge space, thereby producing static magnetic fields between adjacent ones of said magnetic elements, said static magnetic fields extending substantially along said periphery of said discharge space.

2. An apparatus for forming a thin film of a given material on a substrate, comprising:
    a vacuum vessel;
    a first electrode provided in said vacuum vessel being adapted to support a target plate of said given material;
    a second electrode provided opposite to said first electrode in said vacuum vessel to form a discharge space enclosed by said first and second electrodes and an imaginary wall surface defined by peripheral edges of said first and second electrodes, said second electrode being adapted to support said substrate;
    gas supplying means for supplying a sputtering gas into said discharge space;
    power source means for applying a discharge voltage between said first and second electrodes to generate a discharge plasma from said sputtering gas; and
    magnetic field generating means including a plurality of magnetic elements disposed at predetermined intervals around a periphery of said imaginary wall surface, said magnetic elements producing respective static magnetic fields and having respective magnetization directions lying on respective axes, said axes extending towards said imaginary wall surface, said magnetization directions of said magnetic elements being alternately reversed around said periphery of said imaginary wall surface, thereby producing static magnetic fields between adjacent ones of said magnetic elements, said static magnetic fields extending substantially along said periphery of said imaginary wall surface.

3. An apparatus according to claim 2, wherein each of said first and second electrodes is a circular electrode, said discharge space is a circular cylindrical discharge space having a central axis joining centers of the first and second circular electrodes, and said axes on which said magnetization directions of said magnetic elements lie extend towards said central axis of said circular cylindrical discharge space.

4. An apparatus according to claim 3, wherein each of said magnetic elements includes a permanent magnet.

5. An apparatus according to claim 3, wherein each of said magnetic elements includes a coil adapted to be energized by a current to generate a respective static magnetic field having a respective magnetization direction.

6. An apparatus according to claim 2, wherein each of said magnetic elements includes a protective cover.

7. An apparatus according to claim 2, wherein said magnetic field generating means is provided with gas-transmitting portions which enable said sputtering gas supplied from said gas supplying means to flow into said discharge space.

* * * * *